United States Patent
Kim et al.

(10) Patent No.: US 10,957,579 B2
(45) Date of Patent: Mar. 23, 2021

(54) INTEGRATED CIRCUIT DEVICES INCLUDING A VIA AND METHODS OF FORMING THE SAME

(71) Applicant: Samsung Electronics Co., Ltd., Suwon-si (KR)

(72) Inventors: Yung Bae Kim, Seoul (KR); Harsono Simka, Saratoga, CA (US); Jong Hyun Lee, Suwon-si (KR)

(73) Assignee: Samsung Electronics Co., Ltd.

( * ) Notice: Subject to any disclaimer, the term of this patent is extended or adjusted under 35 U.S.C. 154(b) by 21 days.

(21) Appl. No.: 16/530,075

(22) Filed: Aug. 2, 2019

(65) Prior Publication Data
US 2020/0144103 A1     May 7, 2020

Related U.S. Application Data

(60) Provisional application No. 62/756,246, filed on Nov. 6, 2018.

(51) Int. Cl.
*H01L 21/768* (2006.01)

(52) U.S. Cl.
CPC .. *H01L 21/76802* (2013.01); *H01L 21/76829* (2013.01); *H01L 21/76843* (2013.01); *H01L 21/76868* (2013.01)

(58) Field of Classification Search
CPC ......... H01L 21/76802; H01L 21/76868; H01L 21/76843; H01L 21/76829; H01L 21/76832; H01L 21/76834; H01L 21/76865; H01L 21/76883; H01L 21/76897; H01L 23/49811; H01L 23/49838; H01L 23/5386; H01L 21/4853
See application file for complete search history.

(56) References Cited

U.S. PATENT DOCUMENTS

| | | | |
|---|---|---|---|
| 9,059,257 B2 | 6/2015 | Li et al. |
| 9,324,650 B2 | 4/2016 | Edelstein et al. |
| 9,368,395 B1 | 6/2016 | Wei et al. |
| 9,373,584 B2 | 6/2016 | Boyanov et al. |
| 9,484,258 B1 | 11/2016 | Kim et al. |

(Continued)

OTHER PUBLICATIONS

Murdoch et all, Feasibility Study of Fully Self Aligned Vias for 5nm Node BEOL, IITC, 2017, Abstract only.

(Continued)

*Primary Examiner* — Karen Kusumakar
(74) *Attorney, Agent, or Firm* — Myers Bigel, P.A.

(57) ABSTRACT

Integrated circuit devices and methods of forming the same are provided. The methods of forming an integrated circuit device may include forming a first insulating layer and a first conductive layer on a substrate and selectively forming a second insulating layer on the first insulating layer. The first insulating layer may include a recess, and the first conductive layer may be in the recess of the first insulating layer. The second insulating layer may include a first opening exposing a surface of the first conductive layer. The methods may also include forming a third insulating layer on the second insulating layer and the first conductive layer, forming a second opening extending through the third insulating layer and exposing the first conductive layer, and forming a second conductive layer in the second opening.

20 Claims, 6 Drawing Sheets

(56) References Cited

U.S. PATENT DOCUMENTS

| | | |
|---|---|---|
| 9,520,321 B2 | 12/2016 | Ryan et al. |
| 9,530,691 B1 | 12/2016 | Zhang et al. |
| 9,659,864 B2 | 5/2017 | Wu et al. |
| 9,793,159 B2 | 10/2017 | Wallace et al. |
| 9,818,690 B2 | 11/2017 | Tsai et al. |
| 9,837,314 B2 | 12/2017 | Smith et al. |
| 9,847,252 B2 | 12/2017 | Mebarki et al. |
| 9,911,690 B2 | 3/2018 | Edelstein et al. |
| 9,960,110 B2 | 5/2018 | Boyanov |
| 9,966,337 B1 | 5/2018 | Briggs et al. |
| 10,020,224 B2 | 7/2018 | Anderson et al. |
| 10,049,974 B2 * | 8/2018 | Briggs ................. H01L 23/498 |
| 10,090,247 B1 | 10/2018 | Briggs et al. |
| 2018/0040510 A1 | 2/2018 | Briggs et al. |
| 2018/0102317 A1 | 4/2018 | Edelstein et al. |
| 2018/0122682 A1 | 5/2018 | Lee |
| 2018/0122691 A1 | 5/2018 | Briggs et al. |
| 2018/0130708 A1 | 5/2018 | Mohanty et al. |
| 2018/0151432 A1 | 5/2018 | Chen et al. |
| 2018/0233407 A1 | 8/2018 | Tapily et al. |
| 2018/0286749 A1 | 10/2018 | Zhang et al. |

OTHER PUBLICATIONS

Ben D. Briggs, Fully Aligned Via Integration for Extendibility of Interconnects to Beyond the 7nm Node, IEDM, 2017, Abstract only.

* cited by examiner

INTEGRATED CIRCUIT DEVICES INCLUDING A VIA AND METHODS OF FORMING THE SAME

CROSS-REFERENCE TO RELATED APPLICATION

This application claims priority to U.S. Provisional Application Ser. No. 62/756,246, entitled BEOL INTERCONNECT WITH RECESS AND SELECTIVE DEPOSITION FOR FULLY ALIGNED VIAS, filed in the USPTO on Nov. 6, 2018, the disclosure of which is hereby incorporated by reference herein in its entirety.

FIELD

The present disclosure generally relates to the field of electronics and, more particularly, to integrated circuit devices.

BACKGROUND

A self-aligned via (SAV) structure has been introduced to enhance electrical isolation between a via and an adjacent conductive layer by providing a layer having a high etch selectivity. The SAV structure, however, may not be effective to provide electrical isolation between a via and an adjacent conductive layer in high density integrated circuit devices.

SUMMARY

According to some embodiments of the present inventive concept, methods of forming an integrated circuit device may include forming a first insulating layer and a first conductive layer on a substrate and selectively forming a second insulating layer on the first insulating layer. The first insulating layer may include a recess, and the first conductive layer may be in the recess of the first insulating layer. The second insulating layer may include a first opening exposing a surface of the first conductive layer. The methods may also include forming a third insulating layer on the second insulating layer and the first conductive layer, forming a second opening extending through the third insulating layer and exposing the first conductive layer, and forming a second conductive layer in the second opening.

According to some embodiments of the present inventive concept, methods of forming an integrated circuit device may include forming a first insulating layer and a first conductive layer on a substrate and forming a blocking layer on the first conductive layer. The first insulating layer may include a recess, and the first conductive layer may be in the recess of the first insulating layer. The blocking layer may expose a surface of the first insulating layer. The methods may also include forming a second insulating layer on the first insulating layer, and the second insulating layer may expose a surface of the blocking layer. The methods may further include removing the blocking layer to form an opening in the second insulating layer, forming a third insulating layer on the second insulating layer and the first conductive layer after removing the blocking layer, and forming a second conductive layer extending through the third insulating layer. The second conductive layer may contact the first conductive layer.

According to some embodiments of the present inventive concept, methods of forming an integrated circuit device may include forming a first insulating layer and a first conductive layer on a substrate. The first insulating layer may include a recess, the first conductive layer may be in the recess of the first insulating layer, and the first insulating layer may expose an upper surface of the first conductive layer. The methods may also include removing an upper portion of the first conductive layer, and selectively forming a second insulating layer on the first insulating layer. The second insulating layer may expose a surface of the first conductive layer that remains after removing the upper portion of the first conductive layer. The methods may further include forming a third insulating layer on the second insulating layer and the first conductive layer and forming a second conductive layer extending through the third insulating layer to contact the first conductive layer.

DETAILED DESCRIPTION

Figure 1:
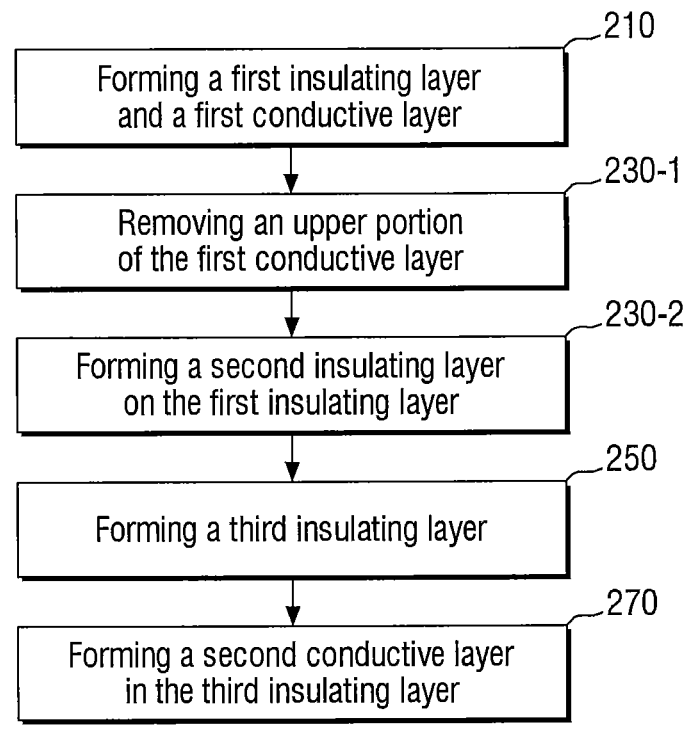
FIG. 1 is a flow chart of a method of forming an integrated circuit device according to some embodiments of the inventive concept.

FIG. 1 is a flow chart of a method of forming an integrated circuit device according to some embodiments of the inventive concept. FIGS. 2 to 9 are cross-sectional views illustrating a method of forming an integrated circuit device according to some embodiments of the inventive concept.

Figure 2:
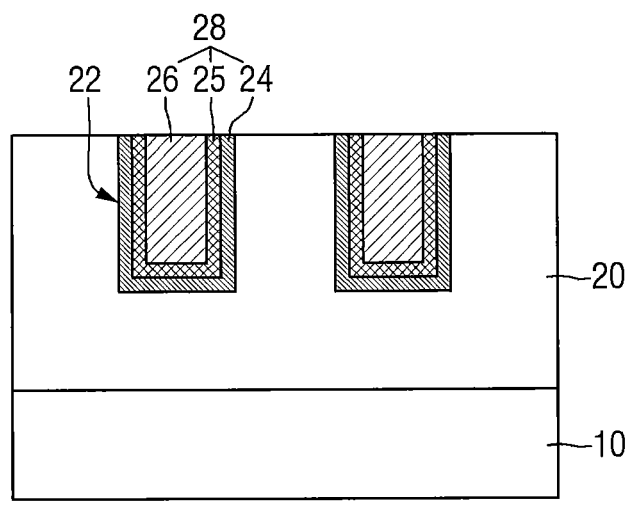
FIGS. 2 to 9 are cross-sectional views illustrating a method of forming an integrated circuit device according to some embodiments of the inventive concept.

Referring to FIGS. 1 and 2, a method may include forming a first insulating layer 20 and a first conductive layer 28 on a substrate 10 (Block 210). The substrate 10 may include one or more semiconductor materials, for example, Si, Ge, SiGe, GaP, GaAs, SiC, SiGeC and/or InP. In some embodiments, the substrate 10 may be a bulk substrate (e.g., a bulk silicon substrate) or a semiconductor on insulator (SOI) substrate. In some embodiments, the first conductive layer 28 may be a metal line that is formed during back end of line (BEOL) processes. Accordingly, although FIG. 2 shows that the first insulating layer 20 contacts the substrate 10, it will be understand that there may be various intervening elements between the substrate 10 and the first insulating layer 20.

The first insulating layer 20 may include a recess 22 therein and the first conductive layer 28 may be in the recess 22. The first insulating layer 20 may be a porous layer or a dense layer. For example, the first insulating layer 20 may include a low k material, an ultra-low k material, SiCOH, $SiO_2$, SiN, SiCON, SiCN, AlO, AlN, SiOC, and/or SiON.

In some embodiments, the first conductive layer 28 may include multiple layers. For example, the first conductive layer 28 may include a first diffusion barrier layer 24, a first liner layer 25, and a first core conductive layer 26. The first diffusion barrier layer 24 may have a uniform thickness along a surface of the recess 22, as illustrated in FIG. 2. In some embodiments, the first liner layer 25 may have a uniform thickness along a surface of the first diffusion barrier layer 24, as illustrated in FIG. 2.

Each of the first liner layer 25 and the first core conductive layer 26 may include a metal, for example, Cu, Co, Ru, Mn, Nb, and/Mo. In some embodiments, the first liner layer 25 may include a material that the first core conductive layer 26 includes. Moreover, the first diffusion barrier layer 24 may include Ta, TaN, Ti, and/or TiN and may be formed using, for example, a physical vapor deposition (PVD) process, an atomic layer deposition (ALD) process, a chemical vapor deposition (CVD) process, and/or a plating process.

Figure 3:
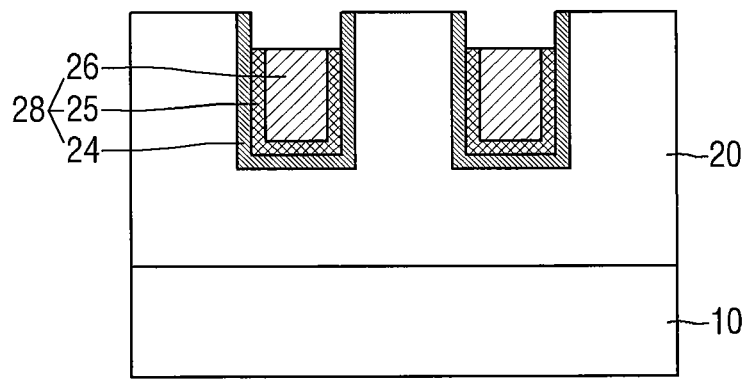
Figure 4:
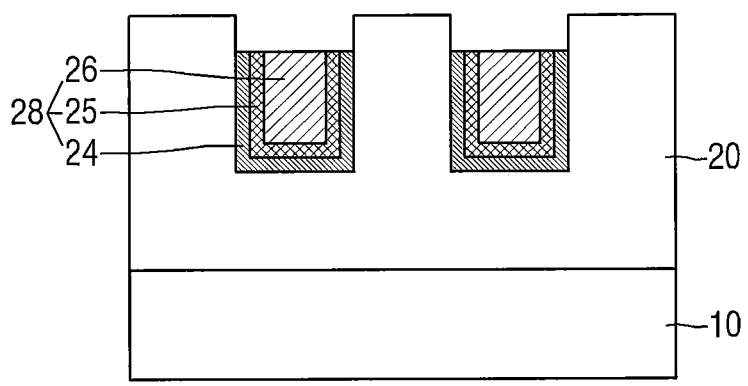

Referring to FIGS. 1, 3, and 4, the method may also include removing an upper portion of the first conductive layer 28 (Block 230-1). In some embodiments, upper portions of the first liner layer 25 and the first core conductive layer 26 may be concurrently removed as illustrated in FIG. 3. After removing the upper portions of the first liner layer 25 and the first core conductive layer 26, an upper portion of the first diffusion barrier layer 24 may be removed as illustrated in FIG. 4. It will be understood that "removed concurrently" refers to being removed in a same fabrication step, at approximately (but not necessarily exactly) the same time, or in parallel steps that at least partially overlap in time.

It will be understood that the upper portions of the first liner layer 25 and the first core conductive layer 26 can be removed after the upper portion of the first diffusion barrier layer 24 is removed. In some embodiments, the upper portions of the first diffusion barrier layer 24, the first liner layer 25, and the first core conductive layer 26 may be removed concurrently. Removing the upper portions of the first diffusion barrier layer 24, the first liner layer 25, and the first core conductive layer 26 may be performed by a wet etching process and/or a dry etching process.

Figure 5:
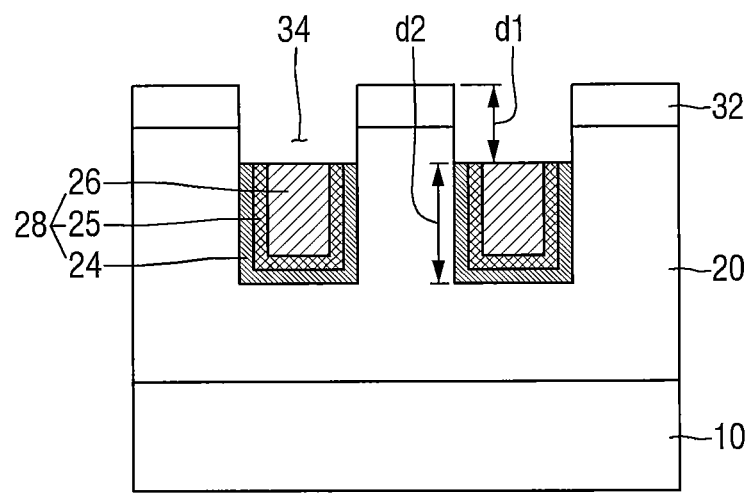

Referring to FIGS. 1 and 5, the method may include selectively forming a second insulating layer 32 on the first insulating layer 20 (Block 230-2). For example, the second insulating layer 32 may include a low k material, an ultra-low k material, SiCOH, $SiO_2$, SiN, SiCON, SiCN, AlO, AlN, SiOC, and/or SiON. As the second insulating layer 32 is selectively formed on the first insulating layer 20, the second insulating layer 32 may not be formed on the first diffusion barrier layer 24, the first liner layer 25, and the first core conductive layer 26. Accordingly, the second insulating layer 32 may include a first opening 34 exposing the first diffusion barrier layer 24, the first liner layer 25, and the first core conductive layer 26, as illustrated in FIG. 5.

In some embodiments, the second insulating layer 32 may contact the first insulating layer 20. After removing the upper portions of the first diffusion barrier layer 24, the first liner layer 25, and the first core conductive layer 26, the first opening 34 may have a depth d1 in a vertical direction, and the first diffusion barrier layer 24 may have a thickness d2 in the vertical direction. The vertical direction may be in which the substrate 10 and the first insulating layer 20 may be stacked. In some embodiments, a ratio the depth d1 to the thickness d2 may be 1:2 to 1:3. It will be understood that the second insulating layer 32 may increase the depth d1 of the first opening 34.

In some embodiments, removing the upper portions of the first diffusion barrier layer 24, the first liner layer 25, and the first core conductive layer 26 may be omitted and the first opening 34 may be formed by only forming the second insulating layer 32. When the first opening 34 is formed by only forming the second insulating layer 32, the second insulating layer 32 may have a thickness that is the same as the value of the depth d1 of the first opening 34. In some embodiments, removing the upper portions of the first diffusion barrier layer 24, the first liner layer 25, and the first core conductive layer 26 may be performed after the second insulating layer 32 is formed.

Figure 6:
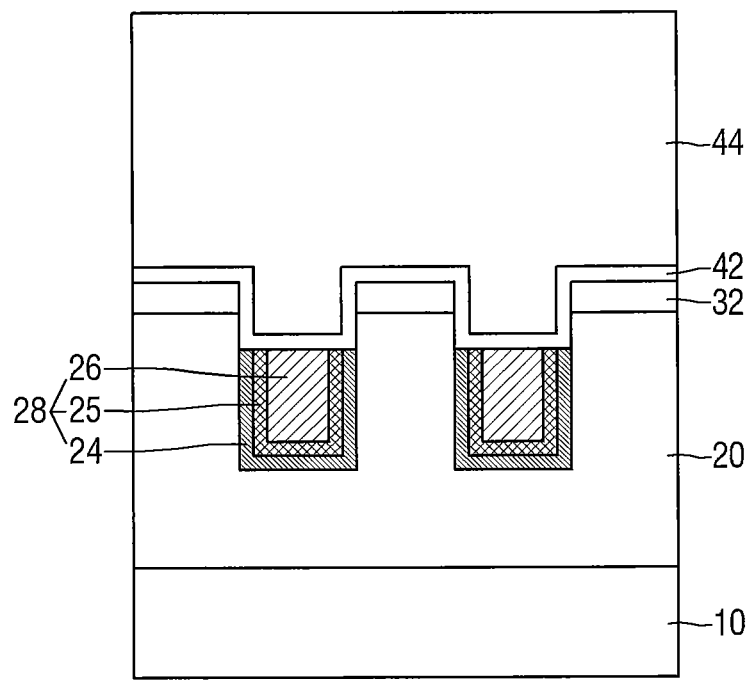

Referring to FIGS. 1 and 6, the method may include forming a third insulating layer 44 on the second insulating layer 32, the first diffusion barrier layer 24, the first liner layer 25, and the first core conductive layer 26 (Block 250). In some embodiments, an etch stop layer 42 may be formed before the third insulating layer 44 is formed. In some embodiments, the etch stop layer 42 may have a uniform thickness as illustrated in FIG. 6.

The etch stop layer 42 may include, for example, AlN, AlO, SiCN, SiN, and/or SiON, and the third insulating layer 44 may include, for example, a low k material, an ultra-low k material, SiCOH, $SiO_2$, SiN, SiCON, SiCN, AlO, AlN, SiOC, and/or SiON.

Figure 7:
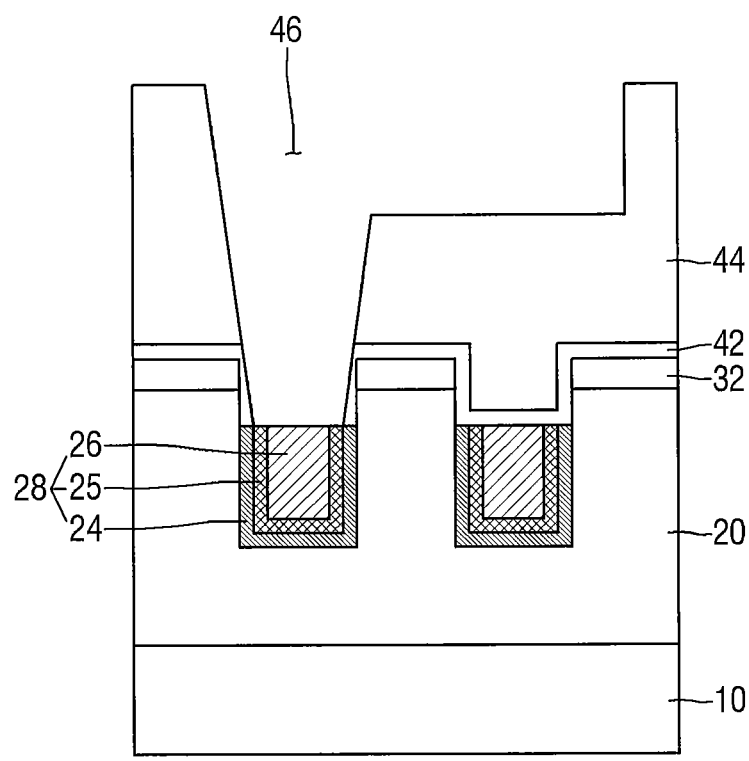

Referring to FIG. 7, the method may include forming a second opening 46 in the third insulating layer 44. The second opening 46 may extend through the third insulating layer 44 and the etch stop layer 42 such that upper portions of the first liner layer 25 and the first core conductive layer 26 may be exposed to the second opening 46. Although FIG. 6 shows that the second opening 46 does not expose the first diffusion barrier layer 24, in some embodiments, the second opening 46 may expose an upper portion of the first diffusion barrier layer 24. The second opening 46 may be formed by removing portions of the third insulating layer 44 and the etch stop layer 42 by performing a wet etching process and/or a dry etching process.

Figure 8:
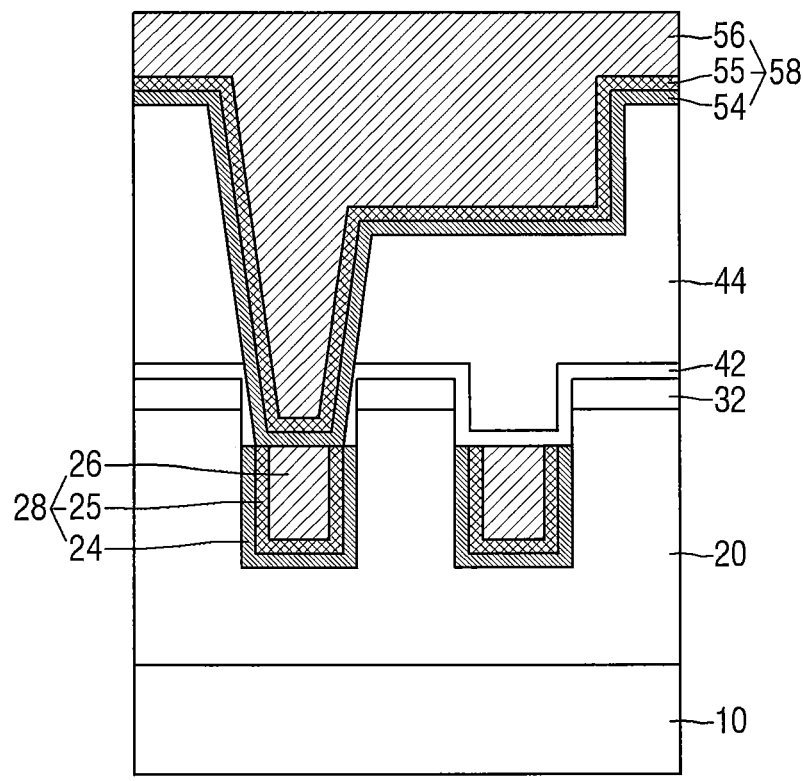
Figure 9:
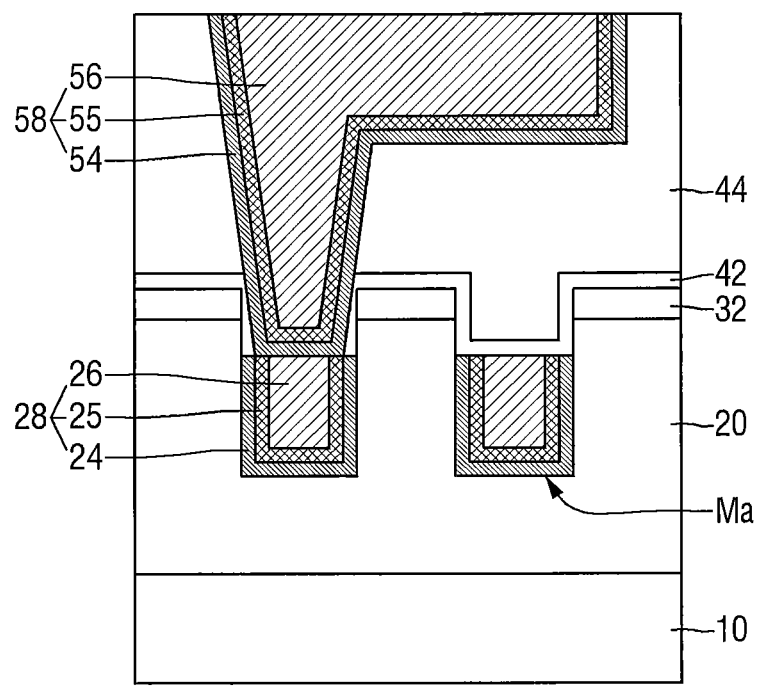

Referring to FIGS. 1, 8, and 9 the method may include forming a second conductive layer 58 in the second opening 46 (Block 270). Forming the second conductive layer 58 may include sequentially forming a second diffusion barrier layer 54, a second liner layer 55, and a second core conductive layer 56 in the second opening 46. In some embodiments, the second diffusion barrier layer 54 may have a uniform thickness in the second opening 46, as illustrated in FIG. 8. In some embodiments, the second liner layer 55 may have a uniform thickness along a surface of the second diffusion barrier layer 54 as illustrated in FIG. 8. In some embodiments, an upper surface of the substrate 10 is closer to a lowermost end of the second conductive layer 58 than an uppermost end of the second insulating layer 32.

Each of the second liner layer 55 and the second core conductive layer 56 may include a metal, for example, Cu, Co, Ru, Mn, Nb, and/Mo. The second diffusion barrier layer 54 may include, for example, Ta, TaN, Ti, and/or TiN and may be formed using, for example, a PVD process, an ALD process, a CVD process, and/or a plating process.

Referring to FIG. 9, upper portions of the second diffusion barrier layer 54, the second liner layer 55, and the second core conductive layer 56 may be removed such that an upper surface of the third insulating layer 44 is exposed. The upper portions of the second diffusion barrier layer 54, the second liner layer 55, and the second core conductive layer 56 may be removed by a wet etching process, a dry etching process, and/or a chemical mechanical polishing (CMP) process.

As illustrated in FIG. 9, a lower portion of the second conductive layer 58 may be formed in a space defined by the etch stop layer 42 and thus the lower portion of the second conductive layer 58 may be separated from adjacent conductive elements (e.g., an adjacent first conductive layer Ma) by the etch stop layer 42. Further, the lower portion of the second conductive layer 58 may be formed in an opening (e.g., the first opening 34 in FIG. 5), a depth of which is increased by the second insulating layer 32. Accordingly, electrical isolation between the second conductive layer 58 and adjacent conductive elements (e.g., an adjacent first conductive layer Ma) may be enhanced.

Figure 10:
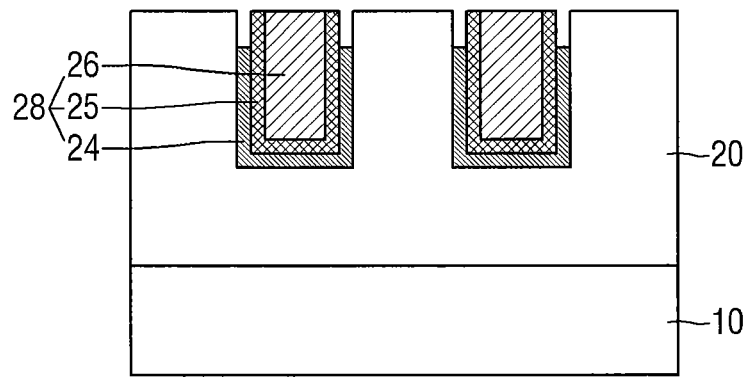
FIGS. 10 and 11 are cross-sectional views illustrating a method of forming an integrated circuit device according to some embodiments of the inventive concept.
Figure 11:
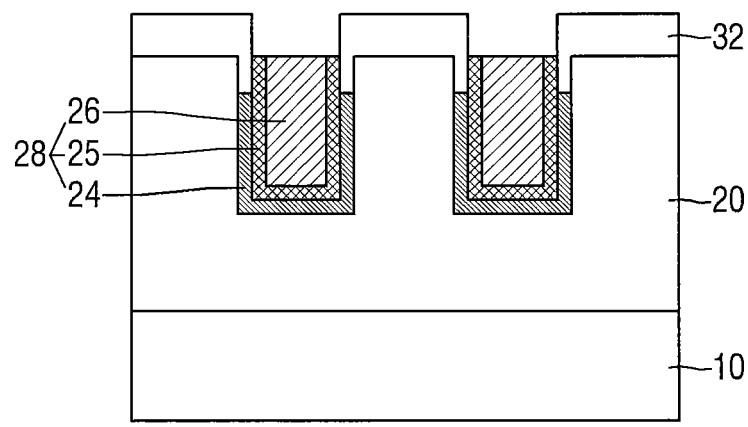

FIGS. 10 and 11 are cross-sectional views illustrating a method of forming an integrated circuit device according to some embodiments of the inventive concept. Referring to FIGS. 10 and 11, an upper portion of the first diffusion barrier layer 24 may be removed but upper portions of the first liner layer 25 and the first core conductive layer 26 may not be removed. When the second insulating layer 32 is formed, a portion of the second insulating layer 32 may be formed in a space from which the upper portion of the first diffusion barrier layer 24 was removed as illustrated in FIG. 11. An uppermost surface of the first diffusion barrier layer 24 may be lower than each of uppermost surfaces of the first liner layer 25 and the first core conductive layer 26.

Figure 12:
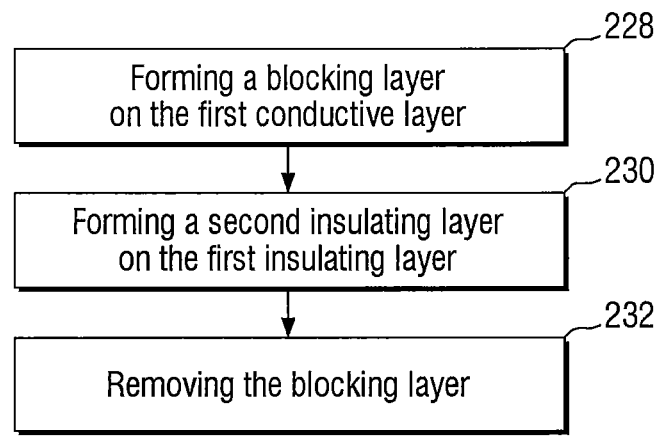
FIG. 12 is a flow chart of a method of forming an integrated circuit device according to some embodiments of the inventive concept.
Figure 13:
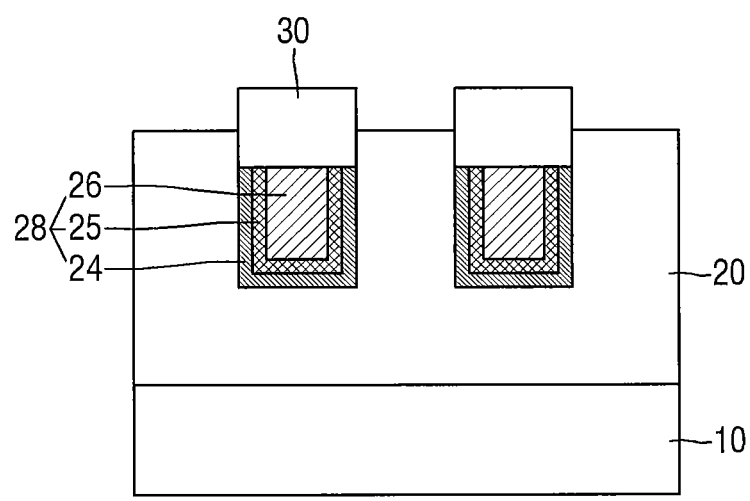
FIGS. 13 to 14 are cross-sectional views illustrating a method of forming an integrated circuit device according to some embodiments of the inventive concept.
Figure 14:
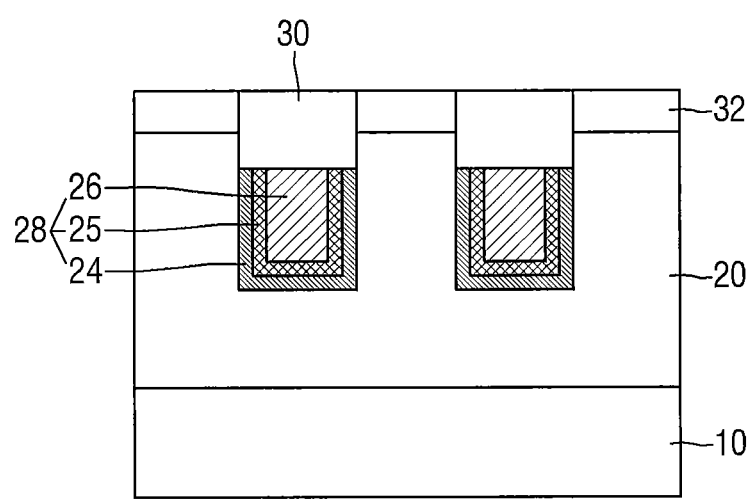

FIG. 12 is a flow chart of a method of forming an integrated circuit device according to some embodiments of the inventive concept. FIGS. 13 and 14 are cross-sectional views illustrating a method of forming an integrated circuit device according to some embodiments of the inventive concept.

In some embodiments, the second insulating layer 32 may be formed by processes illustrated in FIGS. 12 to 14. Referring to FIG. 13, a blocking layer 30 may be formed on the first conductive layer 28 (Block 228 of FIG. 12). In some embodiments, the blocking layer 30 may be selectively formed on the first conductive layer 28, and thus the blocking layer 30 may not be formed on the first insulating layer 20 and may expose the first insulating layer 20. For example, the blocking layer 30 may expose an entirety of an upper surface of the first insulating layer 20. The blocking layer 30 may be formed using, for example, a self-aligned monolayer process. In some embodiments, the blocking layer 30 may be formed using a precursor that selectively reacts with metal elements included in the first conductive layer 28.

Referring to FIG. 14, the second insulating layer 32 may be formed on the first insulating layer 20. In some embodiments, a preliminary second insulating layer may be formed on the blocking layer 30 and the first insulating layer 20 (Block 230 of FIG. 12), and an upper portion of the preliminary second insulating layer may be removed. In some embodiments, the upper portion of the preliminary second insulating layer may be removed until an upper surface of the blocking layer 30 is exposed as illustrated in FIG. 14. The upper portion of the preliminary second insulating layer may be removed using a wet etching process, a dry etching process, and/or a CMP process.

Referring back to FIG. 5, the first opening 34 may be formed by removing the blocking layer 30 using a wet etching process and/or a dry etching process (Block 232 of FIG. 12).

As illustrated in FIG. 13, in some embodiments, the blocking layer 30 may be formed after removing upper portions of the first conductive layer 28. It will be understood that processes removing the upper portion of the first conductive layer 28 may remove impurities and/or contaminants on the first conductive layer 28, and thus the blocking layer 30 may be formed uniformly.

Example embodiments are described herein with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete and will convey the scope of the disclosure to those skilled in the art. In the drawings, the sizes and relative sizes of layers and regions may be exaggerated for clarity. Like reference numbers refer to like elements throughout.

Example embodiments of the present inventive concept are described herein with reference to cross-sectional views or plan views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present inventive concept should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, steps, operations, elements and/or components, but do not preclude the presence or addition of one or more other features, steps, operations, elements, components and/or groups thereof. As used herein the term "and/or" includes any and all combinations of one or more of the associated listed items.

It will be understood that references herein to "an element A vertically overlapping an element B" (or similar language) means that a vertical line intersecting both the elements A and B exists. It will be understood that although the terms first, second, etc. may be used herein to describe various elements, these elements should not be limited by these terms. These terms are only used to distinguish one element from another. Thus, a first element could be termed a second element without departing from the teachings of the present inventive concept.

It should be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present inventive concept.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A method of forming an integrated circuit device, the method comprising:
   forming a first insulating layer and a first conductive layer on a substrate, the first insulating layer comprising a recess, and the first conductive layer being in the recess of the first insulating layer;
   selectively forming a second insulating layer on the first insulating layer, the second insulating layer comprising a first opening exposing a surface of the first conductive layer;
   forming a third insulating layer on the second insulating layer and the first conductive layer;
   forming a second opening extending through the third insulating layer and exposing the first conductive layer; and
   forming a second conductive layer in the second opening,
   wherein forming the first conductive layer comprises forming a diffusion barrier layer and a first core conductive layer, and
   wherein the method further comprises removing an upper portion of the diffusion barrier layer before forming the third insulating layer.

2. The method of claim 1, further comprising removing an upper portion of the first conductive layer before forming the third insulating layer.

3. The method of claim 2, wherein removing the upper portion of the first conductive layer is performed before selectively forming the second insulating layer.

4. The method of claim 1, wherein removing the upper portion of the diffusion barrier layer is performed before selectively forming the second insulating layer, and
   wherein selectively forming the second insulating layer comprises forming a portion of the second insulating layer in a space from which the upper portion of the diffusion barrier layer is removed.

5. The method of claim 1, further comprising forming an etch stop layer on the second insulating layer before forming the third insulating layer.

6. The method of claim 1, wherein the second conductive layer contacts the first conductive layer.

7. The method of claim 6, wherein an upper surface of the substrate is closer to a lowermost end of the second conductive layer than a lowermost end of the second insulating layer.

8. A method of forming an integrated circuit device, the method comprising:
   forming a first insulating layer and a first conductive layer on a substrate, the first insulating layer comprising a recess, and the first conductive layer being in the recess of the first insulating layer;
   forming a blocking layer on the first conductive layer, the blocking layer exposing a surface of the first insulating layer;
   forming a second insulating layer on the first insulating layer, the second insulating layer exposing a surface of the blocking layer;
   removing the blocking layer to form an opening in the second insulating layer;
   forming a third insulating layer on the second insulating layer and the first conductive layer after removing the blocking layer; and
   forming a second conductive layer extending through the third insulating layer, the second conductive layer contacting the first conductive layer.

9. The method of claim 8, wherein the blocking layer contacts an entirety of an upper surface of the first conductive layer.

10. The method of claim 8, wherein the first insulating layer comprises a material that the second insulating layer comprises.

11. The method of claim 8, further comprising removing an upper portion of the first conductive layer before forming the third insulating layer.

12. The method of claim 11, wherein removing the upper portion of the first conductive layer is performed before forming the blocking layer.

13. The method of claim 8, wherein forming the first conductive layer comprises forming a diffusion barrier layer and a first core conductive layer; and
    wherein the method further comprises removing an upper portion of the diffusion barrier layer before forming the third insulating layer.

14. The method of claim 13, wherein removing the upper portion of the diffusion barrier layer is performed before forming the blocking layer, and
    wherein forming the second insulating layer comprises forming a portion of the second insulating layer in a space from which the upper portion of the diffusion barrier layer is removed.

15. The method of claim 8, wherein the first conductive layer comprises Cu, Co, Ru, Mo, Mn, and/or Nb.

16. A method of forming an integrated circuit device, the method comprising:
    forming a first insulating layer and a first conductive layer on a substrate, the first insulating layer comprising a recess, the first conductive layer being in the recess of the first insulating layer, and the first insulating layer exposing an upper surface of the first conductive layer;
    removing an upper portion of the first conductive layer;
    selectively forming a second insulating layer on the first insulating layer, wherein the first insulating layer and the second insulating layer comprise an opening exposing a surface of the first conductive layer that remains after removing the upper portion of the first conductive layer, and the opening exposes a sidewall of the first insulating layer and a sidewall of the second insulating layer;
    forming a third insulating layer on the second insulating layer and the first conductive layer; and
    forming a second conductive layer extending through the third insulating layer to contact the first conductive layer.

17. The method of claim 16, wherein selectively forming the second insulating layer comprises:
    forming a blocking layer on the first conductive layer, the blocking layer exposing a surface of the first insulating layer;
    forming the second insulating layer on the first insulating layer, the second insulating layer exposing a surface of the blocking layer; and
    removing the blocking layer.

18. The method of claim 17, wherein the blocking layer contacts the first conductive layer, and
    wherein the second insulating layer contacts the first insulating layer.

19. The method of claim 16, wherein removing the upper portion of the first conductive layer is performed before selectively forming the second insulating layer.

20. The method of claim 1, wherein the first opening comprises an upper portion, and the first opening further comprises a lower portion that exposes a sidewall of the first insulating layer.

* * * * *